United States Patent [19]

Takeda

[11] Patent Number: 5,053,308

[45] Date of Patent: Oct. 1, 1991

[54] LIGHT-SENSITIVE COMPOSITION COMPRISING SILVER HALIDE DISPERSED IN POLYMERIZABLE COMPOUND AND LIGHT-SENSITIVE MATERIAL EMPLOYING THE SAME

[75] Inventor: Keiji Takeda, Minami-ashigara, Japan

[73] Assignee: Fuji Photo Film Co., Ltd., Kanagawa, Japan

[21] Appl. No.: 559,545

[22] Filed: Jul. 20, 1990

Related U.S. Application Data

[63] Continuation of Ser. No. 315,206, Feb. 24, 1989, abandoned, which is a continuation-in-part of Ser. No. 3,338, Jan. 14, 1987, abandoned.

[30] Foreign Application Priority Data

Jan. 14, 1986 [JP] Japan .................................. 61-5750
Jan. 14, 1986 [JP] Japan .................................. 61-5751

[51] Int. Cl.$^5$ ........................... G03C 1/68; G03C 1/72
[52] U.S. Cl. ................................... 430/138; 430/231; 430/232; 430/281
[58] Field of Search ................. 430/138, 231, 232, 281

[56] References Cited

U.S. PATENT DOCUMENTS

| | | | |
|---|---|---|---|
| 3,694,252 | 9/1972 | Gerber et al. | 430/138 |
| 3,694,253 | 9/1972 | Gerber et al. | 430/138 |
| 3,697,279 | 10/1972 | Rogers et al. | 430/138 |
| 3,701,663 | 10/1972 | Kondo et al. | 430/138 |
| 4,501,809 | 2/1985 | Hiraishi et al. | 430/138 |
| 4,547,450 | 10/1985 | Maeda et al. | 430/269 |
| 4,557,997 | 12/1985 | Iwasaki et al. | 430/325 |
| 4,576,891 | 3/1986 | Adair et al. | 430/138 |
| 4,599,271 | 7/1986 | Chao | 430/138 |
| 4,629,676 | 12/1986 | Hayakawa et al. | 430/203 |
| 4,689,286 | 8/1987 | Schranz et al. | 430/138 |

FOREIGN PATENT DOCUMENTS

0174634 3/1986 European Pat. Off. .
0202490 11/1986 European Pat. Off. .
1292059 10/1986 United Kingdom .

OTHER PUBLICATIONS

Photographic Science and Engineering, vol. 6, No. 4, Jul./Aug. 1962, pp. 222–226, S. Levinos et al., "Photopolymerization Induced by Metal Salts: I. Silver Salt Catalysts".

Derwent Japanese Patent Abstracts, vol. 5, No. 23, Jul. 21, 1971, p. 3, Section G, London, G.B. & JP-B-7121187.

American Chemical Society, Proceedings of the Symposium on Microencapsulation, Proc. 1973, J. E. Vande Gaer; Microencapsulation; Processes Add Application, Chicago, Aug. 28, 1973.

Primary Examiner—Charles L. Bowers, Jr.
Assistant Examiner—Patrick A. Doody
Attorney, Agent, or Firm—Sughrue, Mion, Zinn, Macpeak & Seas

[57] ABSTRACT

A light-sensitive composition in which microcapsules having a core material comprising a silver halide emulsion are dispersed in a polymerizable compound, and a light-sensitive material comprising a light-sensitive layer containing the light-sensitive composition and a reducing agent provided on a support.

8 Claims, No Drawings

LIGHT-SENSITIVE COMPOSITION COMPRISING SILVER HALIDE DISPERSED IN POLYMERIZABLE COMPOUND AND LIGHT-SENSITIVE MATERIAL EMPLOYING THE SAME

This is a continuation of application Ser. No. 07/315,206, filed Feb. 24, 1989, abandoned, which is a continuation application of application Ser. No. 07/003,338, filed Jan. 14, 1987, now abandoned.

BACKGROUND OF THE INVENTION

1. Field of the invention

This invention relates to a light-sensitive composition comprising silver halide dispersed in a polymerizable compound, and further relates to a light-sensitive material comprising a light-sensitive layer containing silver halide, a reducing agent and a polymerizable compound provided on a support.

2. Description of prior arts

Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143 describe light-sensitive materials which comprise a support and a light-sensitive layer containing silver halide, a reducing agent and a polymerizable compound which are employable in image forming methods in which an image is formed on a portion of silver halide latent image through polymerization of the polymerizable compound by action of the reducing agent.

These light-sensitive materials can be also used in improved image forming methods employing a dry process which are described in Japanese Patent Provisional Publication Nos. 61(1986)-69062 and 61(1986)-73145 (the contents thereof are described in U.S. patent Ser. No. 775,273 and European Patent Provisional Publication No. 0174634A2), 61(1986)-183640, 61(1986)-188535 and 61(1986)-228441 (the contents thereof are described in U.S. patent Ser. No. 827,702). In the image forming methods, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the portion where the latent image of the silver halide has been formed.

The above-mentioned image-forming methods are based on the principle in which the polymerizable compound is polymerized in the portion where a latent image of the silver halide has been formed.

Japanese Patent Provisional Publication No. 61(1986)-260241 (corresponding to U.S. patent Ser. No. 854,640) describes another image forming method in which the polymerizable compound in a portion where a latent image of the silver halide has not been formed is polymerized. In this method, when the material is heated, the reducing agent functions as polymerization inhibitor in the portion where a latent image of the silver halide has been formed, and the polymerizable compound in the other portion is polymerized.

In these light-sensitive materials, silver halide is preferably contained in oil droplets of the polymerizable compound or microcapsules containing the polymerizable compound to improve sensitivity of the light-sensitive material and sharpness of the obtained image. In the oil droplets and microcapsules, it is preferred that droplets of the silver halide emulsion are finely and stably dispersed in the polymerizable compound. A method for emulsifying the silver halide emulsion in an organic medium such as the polymerizable compound is stated in Research Disclosure No. 18755 (1979). However, fineness and stability of droplets of the silver halide emulsion in the resulting emulsion are not satisfactory.

SUMMARY OF THE INVENTION

An object of the present invention is to provide a light-sensitive composition wherein silver halide is finely and stably dispersed in a polymerizable compound.

Another object of the invention is to provide a light-sensitive material which is improved in sensitivity and gives an image of improved sharpness.

There is provided by the present invention a light-sensitive composition in which microcapsules having a core material comprising a silver halide emulsion are dispersed in a polymerizable compound.

There is also provided by the invention a light-sensitive material comprising a light-sensitive layer containing said light-sensitive composition and a reducing agent provided on a support is also disclosed.

The light-sensitive composition of the invention is characterized in employing the microcapsule having a core material comprising a silver halide emulsion.

The employment of said microcapsules make it possible to very finely disperse silver halide in the polymerizable compound and to keep thus dispersed state. Therefore the light-sensitive material prominently improved in the sensitivity can be prepared employing the light-sensitive composition of the invention.

In the light-sensitive material employing the light-sensitive composition of the invention, the silver halide and the polymerizable compound are located very closely to each other. Thus, the reaction to accelerate (or to inhibit) the polymerization in the portion where a latent image of silver halide has been formed can smoothly progress, and the contrast between the latent image portion and the other portion is made prominently high. Therefore, using the light-sensitive material employing the light-sensitive composition of the invention, a remarkably sharp image can be obtained.

DETAILED DESCRIPTION OF THE INVENTION

The core material of the microcapsule comprising a silver halide emulsion, the shell material of the microcapsule and the polymerizable compound contained in the light-sensitive composition of the present invention are described hereinbelow.

There is no specific limitation with respect to the silver halide emulsion employed for the light-sensitive composition of the invention. Various silver halide emulsions are known in the conventional methods for the preparation of photographic materials.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

There is also no specific limitation with respect to the silver halide grain in the silver halide emulsion. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on the grain size distribution of silver halide grains. The silver halide grains employed in the light-sensitive composition ordinarily have a mean size in the range of from 0.001 to 5 μm, preferably from 0.001 to 2 μm.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion as described in Japanese Patent Application No. 60(1986)-139746.

There is no specific limitation on the shell material of the microcapsule. Various known materials such as polymers in the conventional microcapsules can be employed as the shell material. The shell material preferably is insoluble in the solvent of the silver halide emulsion (water in a general way) as well as in the polymerizable compound. Specifically the shell material preferably has a solubility of not more than 10 weight % both in water and in the polymerizable compound, and more preferably has a solubility of not more than 1 weight %.

Examples of the shell material include ethyl cellulose, acetyl cellulose, polymethylmethacrylate, polyvinyl chloride, vinylidene chloride/acrylonitrile copolymer, polyvinyl acetate, vinyl acetate/vinyl chloride copolymer, styrene/acrylonitrile copolymer, polyester, acrylonitrile/butadiene/styrene (ABS) copolymer, polyamide, chlorinated polyethylene, chlorinated polypropylene, polyvinyl butyral and polyvinyl formal. Among them, ethyl cellulose is most preferred.

The amount of the shell material preferably ranges from 0.1 to 50 weight % based on the polymerizable compound, and more preferably from 0.5 to 10 weight %.

The mean size of the microcapsule preferably ranges from 0.01 to 50 μm, and more preferably from 0.1 to 5 μm.

There is no specific limitation on the polymerizable compound, and any known polymerizable compounds including monomers, oligomers and polymers may be employed for the light-sensitive composition of the invention.

Preferred polymerizable compounds employable for the light-sensitive composition are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include compounds having an epoxy group. Among them, the compounds having an ethylenic unsaturated group are most preferred.

Examples of the compounds having an ethylenic unsaturated group include acrylic acid, salts of acrylic acid, acrylic esters, acrylamide, methacrylic acid, salts of methacrylic acid, methacrylic esters, methacrylamide, maleic anhydride, maleic esters, itaconic esters, styrene, styrene derivatives (e.g., divinyl benzene), vinyl ethers, vinyl esters, N-vinyl heterocyclic compounds, allyl ethers, allyl esters, and compounds carrying a group or groups corresponding to one or more of these compounds. Examples of the compounds having an epoxy group include glycidyl ethers (e.g., diglycidyl ether of bisphenol A, polyglycidyl ether of novolak, epoxidized oil, and epoxidazed polybutadiene).

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compound can be used singly or in combination of two or more compounds. The viscosity of the polymerizable compound liquid can be easily adjusted using two or more compounds having different viscosity.

The amount of the polymerizable compound to be incorporated into the light-sensitive composition preferably ranges from 5 to $1.2 \times 10^5$ times (by weight) as much as the amount of silver halide, more preferably from 10 to $1 \times 10^4$ times as much as the amount of the silver halide.

The light-sensitive composition may further contain optional components such as reducing agents, color image-forming substances, sensitizing dyes, organic silver salts, various kinds of image formation accelerators (e.g., bases, base precursors, oils, surface active agents, hot-melt compounds), thermal polymerization inhibitors, thermal polymerization initiators, development-stopping agents, fluorescent brightening agents, fading inhibitors, antihalation dyes or pigments, antiirradiation dyes or pigments, matting agents, antismudging agents, plasticizers, water releasers, and binders.

The light-sensitive composition of the invention comprising the above-mentioned components can be used in a variety of arts. Particularly, the light-sensitive composition is preferably employed for the preparation of a light-sensitive material.

In the case that the light-sensitive composition is used for a light-sensitive material, the above-mentioned optional components can be arranged outside of the composition in the light-sensitive layer of the material. Details of the optional components will be hereinafter given in descriptions with respect to the light-sensitive material employing the composition of the invention.

The light-sensitive composition of the invention can be prepared, for instance, by the following process.

There is no specific limitation with respect to the preparation of the microcapsule having a core material comprising the silver halide emulsion. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patent Nos. 952,807 and 965,074; a spray-drying process as described in U.S. Pat. No. 3,111,407 and U.K. Patent 930,422; and the like. It is preferable, though not limitative, that the microcapsule is prepared by emulsifying the core material comprising a silver halide emulsion and forming a polymeric membrane (i.e., shell) around the core material.

Preferred examples of the preparation of the microcapsule employing a solvent evaporation method or a solvent extraction method are described below.

The shell material (polymer) of the microcapsule is dissolved in an adequate solvent, and the solution is uniformly mixed in the polymerizable compound. Some optional components such as a color image forming substance can be previously incorporated in the polymerizable compound. Thus, the oil phase in the preparation of the microcapsule can be obtained.

Then the silver halide emulsion (the water phase) is emulsified in the oil phase to obtain a W/O emulsion. The emulsion can be prepared by stirring both phases using a homogenizer, a blender, a mixer or other conventional stirring device. An emulsifying agent can be incorporated in the water phase and/or the oil phase prior to the emulsification.

In the case that the solvent evaporation method is employed, the obtained emulsion is stirred preferably at a temperature from room temperature to 100° C. (if necessary, under reduced pressure) to evaporate the solvent. Thus, the polymer is precipitated along the interface between the silver halide emulsion and the polymerizable compound to obtain the microcapsule having a core material comprising the silver halide emulsion.

In the case that the solvent extraction method is employed, it is necessary that the solvent of the polymer can be mixed with water. In the solvent extraction method, the obtained emulsion is further emulsified in water which may contain the other component such as a water-soluble polymer to obtain a W/O/W double emulsion. In the preparation of the double emulsion, the solvent contained in the polymerizable compound is extracted. Thus, the polymer is precipitated along the interface between the silver halide emulsion and the polymerizable compound (and along the interface between the polymerizable compound and the outer water phase) to obtain an aqueous dispersion having a doubly encapsulated structure in which the outer microcapsule containing the light-sensitive composition of the invention is dispersed in the outer water phase.

Preparation of the light-sensitive material using the light-sensitive composition of the invention is described below.

The light-sensitive composition is preferably emulsified in an aqueous medium to prepare the light-sensitive material. The emulsion of the light-sensitive composition can be processed for forming the shell of the microcapsule (i.e., forming a doubly encapsulated structure). In the case that the solvent extraction method is employed in the preparation of the composition, the aqueous dispersion in which the outer microcapsule contains the light-sensitive composition of the invention can be used as the coating solution of the light-sensitive material.

The aqueous emulsion of the light-sensitive composition is generally coated on a support to form a light-sensitive layer in the conventional manner.

The light-sensitive material employing the above-mentioned light-sensitive composition is described below.

In the light-sensitive material, a light-sensitive layer containing said composition and a reducing agent is provided on a support. Thus composed material is referred hereinafter to as "light-sensitive material".

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound in either a portion where a latent image of the silver halide has been formed or a portion where a latent image of the silver halide has not been formed can be polymerized. In the developing system in which the polymerizable compound in the portion where the latent image has not been formed is polymerized, 1-phenyl-3-pyrazolidone is preferably employed as the reducing agent.

The light-sensitive materials employing the reducing agents having these functions (including compounds referred to as developing agent or hydrazine derivative) are described in Japanese Patent Provisional Publication Nos. 61(1986)-183640, 61(1986)-188535 and 61(1986)-228441, and Japanese Patent Application Nos. 60(1985)-210657, 60(1985)-226084, 60(1985)-227527 and 60(1985)-227528. These reducing agents are also described in T. James, "The Theory of the Photographic Process", 4th edition, 291-334 (1977), Research Disclosure No. 17029, 9-15 (June 1978), and Research Disclosure No. 17643, 22-31 (December 1978). The reducing agents described in the these publications and applications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or organic silver salt) through so-called superadditivity. Another interaction is for a chain reaction in which an oxidized state of one reducing agent formed by a reduction of silver halide (and/or an organic silver salt) induces or inhibits the polymerization of the polymerizable compound via oxidation-reduction reaction with another reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

The light-sensitive material of the invention can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The light-sensitive composition is preferably dispersed in the form of oil droplets in the light-sensitive layer. A light-sensitive material in which a polymerizable compound is dispersed in the form of oil droplets is described in Japanese Patent Application No. 60(1985)-218603. Other components in the light-sensitive layer, such as the reducing agent, the color image forming substances may be also contained in the oil droplets.

The oil droplets of the light-sensitive composition are preferably prepared in the form of microcapsules (i.e., outer microcapsules in the doubly encapsulated structure). There is no specific limitation on the process for the preparation of the outer microcapsules. The light-sensitive material in which oil droplets are present in the form of a microcapsule is described in Japanese Patent Application No. 60(1985)-117089. There is also no specific limitation on the shell material of the outer microcapsule, and various known materials such as polymers which are employed in the conventional microcapsules can be employed as the shell material. The mean size of the outer microcapsule preferably ranges from 0.5 to 50 µm, more preferably 1 to 25 µm, most preferably 3 to 20 µm.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the color image forming substance, and various kinds of substances can be employed. Thus, examples of the color image forming substance include both colored substances (i.e., dyes and pigments) and non-colored or almost non-colored substances (i.e., color former or dye- or pigment-precursor) which develop to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145.

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29–58 (pressure-sensitive copying paper), 87–95 (azo-graphy), 118–120 (heat-sensitive color formation by a chemical change) or in MSS. of the seminer promoted by the Society of Kinki Chemical Industry, "The Newest Chemistry of Coloring Matter—Attractive Application and New Development as a Functional Coloring Matter", 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material of the invention. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion. The light-sensitive material wherein the sensitizing dye has been added during the silver halide grain formation is described in Japanese Patent Application No.

60(1985)-139746. The examples of the sensitizing dye are also described in above Japanese Patent Application No. 60(1985)-139746.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect. The light-sensitive material employing an organic silver salt is described in Japanese Patent Application No. 60(1985)-141799 (corresponding to U.S. patent Ser. No. 879,747).

Various image formation accelerators are employable in the light-sensitive material of the invention. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The light-sensitive material employing base or base precursor is described in Japanese Patent Application No. 60(1985)-227528.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The light-sensitive material employing the hot-melt solvents is described in Japanese Patent Application No. 60(1985)-227527. The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylavaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241 (corresponding to U.S. patent Ser. No. 854,640).

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or almina described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the on the image-receiving layer of the light-sensitive material. The image-receiving layer of the light-sensitive material can be constructed in the same manner as the layer of the image-receiving material. The details of the image-receiving layer will be described later.

The light-sensitive material employing the heating layer is described in Japanese Patent Application No. 60(1985)-135568. Examples and usage of the other auxiliary layers are also described in the above-mentioned publications and applications concerning the light-sensitive material.

Use of the light-sensitive material is described below.

In the use of the light-sensitive material, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either a monochromatic image or a color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound in a portion where a latent image of the silver halide has been formed or in a portion where a latent image of the silver halide has not been formed is polymerized. In a general system, the polymerizable compound in a portion where the latent image has been formed is polymerized. If a nature or amount of the reducing agent is controlled, the polymerizable compound in a portion where the latent image has not been formed can be polymerized in the same manner as the light-sensitive material described in Japanese Patent Provisional Publication No. 61(1986)-260241 (corresponding to U.S. patent Ser. No. 854,640).

In the above development process, a polymer image can be formed on the light-sensitive layer. A pigment image can be also obtained by fixing pigments to the polymer image.

The image can also be formed on the image-receiving material. The image-receiving material is described hereinbelow. The image forming method employing the image-receiving material or the image-receiving layer is described in Japanese Patent Provisional Publication No. 61(1986)-278849 (corresponding to U.S. patent Ser. No. 868,385).

Examples of the material employable as the support of the image-receiving material include baryta paper in addition to various examples which can be employed as the support of the known light-sensitive material.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer.

The image-receiving layer can be composed of two or more layers according to the above-mentioned functions. The thickness of the image-receiving layer preferably ranges from 1 to 100 $\mu$m, more preferably from 1 to 20 $\mu$m.

After the development process, pressing the light-sensitive material in contact with the image-receiving material to transfer the polymerizable compounds which is still polymerizable to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Silver Halide Emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 35 g of sodium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 $\mu$m and a bromide content of 80 mole %.

Preparation of Light-Sensitive Composition

To 20.0 g of trimethylolpropane triacrylate was added 1 g of 3-dimethylamino-6-methyl-7-anilinofluoran, 1.2 g of azobisisobutyronitrile and 4 g of 10 weight % acetone solution of ethyl cellulose, and the mixture was uniformly stirred. To the resulting mixture was added 6.0 g of the silver halide emulsion and 0.6 g of 5 weight % aqueous solution of sodium p-dodecylbenzenesulfonate, and the mixture was stirred at the room temperature to emulsify the silver halide emulsion. The mixture was further stirred for evaporating the acetone to obtain a light-sensitive composition.

The light-sensitive composition was observed using an optical microscope. In the observation, the microcapsules having a core material comprising a silver halide emulsion were very finely dispersed in the light-sensitive composition.

Preparation of Light-Sensitive Material

On a polyethyleneterephthalate film was coated the following coating solution and dried to give a light-sensitive layer having thickness of about 10 $\mu$m. Thus the light-sensitive material employing the light-sensitive composition of the invention was obtained.

| Composition of coating solution | |
|---|---|
| Light-sensitive composition | 10 g |
| 10 weight % ethanol solution of polyvinyl butyral (average molecular weight: 50,000) | 50 g |
| 1 weight % methanol solution of 4-methyl-4'-hydroxymethyl-1-phenyl-3-pyrazolidone | 0.5 g |
| 2 weight % methanol solution of benzotriazole | 0.2 g |
| 10 weight % methanol solution of triethanolamine | 0.3 g |

Preparation of Image-Receiving Material

To 120 g of water was added 10 g of 40% aqueous solution of sodium hexametaphosphate, and were further added 35 g of zinc 3,5-di-$\alpha$-methylbenzylsalicylate and 80 g of 55% slurry of calcium carbonate, followed by coarsely dispersing in a mixer. The coarse dispersion was then finely dispersed in a dynamic dispersing device. To 200 g of the resulting dispersion were added 6 g of 50% latex of SBR (styrene-butadiene rubber) and 55 g of 8% aqueous solution of polyvinyl alcohol and the resulting mixture was made uniform.

The mixture was then uniformly coated on an art paper having a weight of 43 g/m² to give a layer having a wet thickness of 30 $\mu$m and dried to obtain an image-receiving material.

Evaluation of Light-Sensitive Material

The light-sensitive material prepared in Example 1 was imagewise exposed to light using a halogen lamp at 200 lux for 5 second and then heated on a hot plate at 125° C. for 40 seconds. The exposed and heated light-sensitive material was then combined with the image-receiving material and passed through press rolls under pressure of 200 kg/cm². Thus, a clear black positive image was obtained on the image receiving material.

EXAMPLE 2

Preparation of Light-Sensitive Composition

Light-sensitive composition was prepared in the same manner as in Example 1 except that 0.2 g of phthalocyanine was used in place of 1 g of 3-dimethylamino-6-methyl-7-anilinofluoran.

Preparation of Light-Sensitive Material

Light-sensitive material was prepared in the same manner as in Example 1 except that the above light-sensitive composition was used.

Evaluation of Light-Sensitive Material

The light-sensitive material prepared in Example 2 was imagewise exposed and heated in the same manner as in Example 1. The exposed and heated light-sensitive layer of the material was immersed in ethanol to elute the unhardened portion of the light-sensitive layer in ethanol. Thus, a clear blue negative image was obtained on the light-sensitive layer.

EXAMPLE 3

Preparation of Outer Microcapsule

Light-sensitive composition prepared in Example 1 was added to the following aqueous medium, and the mixture was stirred for 10 minutes at 40° C. to emulsify the light-sensitive composition in the aqueous medium.

| Composition of aqueous medium | |
|---|---|
| 10 weight % aqueous solution of gelatin | 20 g |
| 2 weight % aqueous solution of carboxymethyl cellulose | 40 g |
| 5 weight % aqueous solution of sodium p-dodecylbenzenesulfonate | 1 g |

To the emulsion were added 10 g of 20 weight % aqueous solution of sodium sulfate anhydride dropwise over a period of 10 minutes, 30 g of 2 weight % aqueous solution of carboxymethyl cellulose and another 10 g of 20 weight % aqueous solution of sodium sulfate anhydride dropwise over a period of 10 minutes in this order to form geletin shell of the outer microcapsule. To the mixture was added 30 g of water, and the mixture was cooled at 10° C. for 10 minutes. Further to the mixture was added 5 g of 3 weight % aqueous solution of dimethylolurea, and the mixture was made uniform. The resulting mixture was placed under a calm condition at room temperature for 24 hours to obtain a dispersion of the outer microcapsule. The mean size of the outer microcapsule was about 10 μm.

Preparation of Light-Sensitive Material

On a polyethyleneterephthalate film was coated the following coating solution and dried to give a light-sensitive layer having thickness of about 10 μm. Thus the light-sensitive material employing the light-sensitive composition of the invention was obtained.

| Composition of coating solution | |
|---|---|
| Dispersion of the outer microcapsule | 8.0 g |
| Sorbitol | 0.3 g |
| 1 weight % methanol solution of 4-methyl-4'-hydroxymethyl-1-phenyl-3-pyrazolidone | 0.8 g |
| 2 weight % methanol solution of benzotriazole | 0.3 g |
| 10 weight % methanol solution of triethanolamine | 0.5 g |

Evaluation of Light-Sensitive Material

The light-sensitive material prepared in Example 3 was evaluated in the same manner as in Example 1. Thus, a clear black positive image was obtained on the image receiving material.

EXAMPLE 4

Preparation of Light-Sensitive Composition

Light-sensitive composition was prepared in the same manner as in Example 3 except that 1 g of Pargascript Red I (produced by Ciba-Geigy) was used in place of 1 g of 3-dimethylamino-6-methyl-7-anilinofluoran.

Preparation of Light-Sensitive Material

Light-sensitive material was prepared in the same manner as in Example 3 except that the above light-sensitive composition was used.

Evaluation of Light-Sensitive Material

The light-sensitive material prepared in Example 4 was evaluated in the same manner as in Example 1. Thus, a clear magenta positive image was obtained on the image receiving material.

EXAMPLE 5

Preparation of Light-Sensitive Material

On a polyethyleneterephthalate film was coated the following coating solution and dried to give a light-sensitive layer having thickness of about 10 μm. Thus the light-sensitive material employing the light-sensitive composition of the invention was obtained.

| Composition of coating solution | |
|---|---|
| Dipsersion of the outer microcapsule (prepared in Example 3) | 8.0 g |
| Sorbitol | 0.3 g |
| α-p-aminophenyl-β-acetylhydrazine | 0.03 g |
| 2 weight % methanol solution of benzotriazole | 1.0 g |

Evaluation of Light-Sensitive Material

The light-sensitive material prepared in Example 5 was evaluated in the same manner as in Example 1. Thus, a clear black positive image was obtained on the image receiving material.

I claim:

1. A light-sensitive material comprising a light-sensitive layer containing a reducing agent and a light sensitive composition which comprises microcapsules dispersed in a ethylenically unsaturated polymerizable compound provided on a support, said microcapsules having a core material comprising a silver halide emulsion, and said polymerizable compound being present as an oil phase in an amount of 5 to $1.2 \times 10^5$ times by weight as much as the amount of the silver halide contained in the silver halide emulsion, wherein the oil phase is present as outer microcapsules in a doubly encapsulated structure.

2. The light-sensitive material as claimed in claim 1, wherein the light-sensitive layer further contains a color image forming substance.

3. The light-sensitive material as claimed in claim 1, wherein the microcapsules have a shell material having a solubility of not more than 10 weight % both in water and in the polymerizable compound.

4. The light-sensitive material as claimed in claim 1, wherein the microcapsules have a shell material having a solubility of not more than 1 weight % both in water and in the polymerizable compound.

5. The light-sensitive material as claimed in claim 1, wherein the microcapsules have a shell material in an amount of from 0.1 to 50 weight % based on the amount of the polymerizable compound.

6. The light-sensitive material as claimed in claim 1, wherein the microcapsules have a particle size of from 0.01 to 50 μm.

7. The light-sensitive material as claimed in claim 1, wherein the light-sensitive layer further contains a thermal polymerization initiator.

8. The light-sensitive material as claimed in claim 1, wherein the polymerizable compound being present as an oil phase in an amount of 10 to $1 \times 10^4$ times by weight as much as the amount of the silver halide contained in the silver halide emulsion.

* * * * *